United States Patent
Wang et al.

(10) Patent No.: US 11,263,951 B2
(45) Date of Patent: Mar. 1, 2022

(54) SHIFT REGISTER UNIT AND DRIVING METHOD THEREOF, GATE DRIVING CIRCUIT, AND DISPLAY DEVICE

(71) Applicant: BOE TECHNOLOGY GROUP CO., LTD., Beijing (CN)

(72) Inventors: Zhichong Wang, Beijing (CN); Haoliang Zheng, Beijing (CN); Seungwoo Han, Beijing (CN); Guangliang Shang, Beijing (CN); Lijun Yuan, Beijing (CN); Xing Yao, Beijing (CN); Mingfu Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 540 days.

(21) Appl. No.: 16/336,546

(22) PCT Filed: Aug. 14, 2018

(86) PCT No.: PCT/CN2018/100328
§ 371 (c)(1),
(2) Date: Mar. 26, 2019

(87) PCT Pub. No.: WO2019/091168
PCT Pub. Date: May 16, 2019

(65) Prior Publication Data
US 2021/0358381 A1 Nov. 18, 2021

(30) Foreign Application Priority Data
Nov. 7, 2017 (CN) .......................... 201711083507.8

(51) Int. Cl.
*G09G 3/20* (2006.01)
*G11C 19/28* (2006.01)

(52) U.S. Cl.
CPC ... *G09G 3/2092* (2013.01); *G09G 2300/0426* (2013.01); *G09G 2310/0283* (2013.01);
(Continued)

(58) Field of Classification Search
None
See application file for complete search history.

(56) References Cited

U.S. PATENT DOCUMENTS

2009/0121766 A1 5/2009 Jeon
2010/0177082 A1* 7/2010 Joo ...................... G09G 3/3677
345/211
(Continued)

FOREIGN PATENT DOCUMENTS

CN 102682699 A 9/2012
CN 104464628 A 3/2015
(Continued)

OTHER PUBLICATIONS

First Office Action for Chinese Patent Application No. 201711083507.8 dated Jan. 21, 2020.
(Continued)

*Primary Examiner* — Chad M Dicke
(74) *Attorney, Agent, or Firm* — Calfee, Halter & Griswold LLP

(57) ABSTRACT

Disclosed is a shift register unit, including a first input circuit, an input control circuit, a pull-down control circuit, a pull-down circuit, an output circuit and a second input circuit. The first input circuit includes a first input sub-circuit, and is configured to, under control of the first signal input terminal, cause a voltage of the first voltage terminal to be output to a second terminal of the first input sub-circuit and output to the pull-up node via a first terminal thereof. The input control circuit is configured to pull down a potential of the second terminal to the potential of a first
(Continued)

power supply voltage terminal under control of an enable signal terminal.

20 Claims, 8 Drawing Sheets

(52) U.S. Cl.
CPC ............... *G09G 2310/0286* (2013.01); *G09G 2310/061* (2013.01); *G09G 2310/08* (2013.01); *G11C 19/28* (2013.01)

(56) References Cited

U.S. PATENT DOCUMENTS

| | | |
|---|---|---|
| 2014/0253424 A1 | 9/2014 | Yu et al. |
| 2016/0180800 A1 | 6/2016 | Zheng |
| 2016/0182042 A1 | 6/2016 | Kim et al. |
| 2017/0193917 A1 | 7/2017 | Noh et al. |
| 2018/0357974 A1 | 12/2018 | Zheng |

FOREIGN PATENT DOCUMENTS

| | | |
|---|---|---|
| CN | 105096904 A | 11/2015 |
| CN | 106128347 A | 11/2016 |
| CN | 106297697 A | 1/2017 |
| CN | 107068088 A | 8/2017 |
| CN | 107845403 A | 3/2018 |
| EP | 3035325 A1 | 6/2016 |
| EP | 3188179 A1 | 7/2017 |

OTHER PUBLICATIONS

Search Report and Written Opinion for International Application No. PCT/CN2018/100328 dated Nov. 1, 2018.

\* cited by examiner

SHIFT REGISTER UNIT AND DRIVING METHOD THEREOF, GATE DRIVING CIRCUIT, AND DISPLAY DEVICE

RELATED APPLICATIONS

The present disclosure is the U.S. national phase entry of PCT/CN2018/100328, with an international filling date of Aug. 14, 2018, which claims priority to the Chinese patent application No. 201711083507.8 filed on Nov. 7, 2017, the entire disclosure of which is hereby incorporated by reference in its entirety.

FIELD

The present disclosure relates to the technical field of display, and particularly to a shift register unit and a driving method thereof, a gate driving circuit, and a display device.

BACKGROUND

A TFT-LCD (Thin Film Transistor Liquid Crystal Display) or an OLED (Organic Light Emitting Diode) display device has advantages such as low radiation, small size, and low energy consumption, and is widely used in electronic products such as notebook computers, flat-screen TVs or mobile phones.

In the prior art, a GOA (Gate Driver on Array) circuit is generally provided in a non-display area of the display device to perform line-by-line scanning of a gate line. A shift register unit in the GOA circuit may output a gate scan signal to a gate line of the display device display area. When some of switching transistors in the shift register unit are connected to a constant voltage terminal for a long time, such a situation will make those switching transistors be in a forward or negative biased state for a long time. In this case, when the gate of a driving transistor in the shift register unit is connected to those switching transistors, it is possible to lead to an abnormity of the driving transistor and thereby lead to an abnormity of output of the gate scan signal.

SUMMARY

Exemplary embodiments provide a shift register unit and a driving method thereof, a gate driving circuit, and a display device.

In accordance with an exemplary embodiment, there is provided a shift register unit. The shift register unit comprises a first input circuit, an input control circuit, a pull-down control circuit, a pull-down circuit, an output circuit and a second input circuit. The first input circuit is connected to a first signal input terminal, a pull-up node, a first voltage terminal, and the input control circuit, and comprises a first input sub-circuit. The first input circuit is connected to the pull-up node via a first terminal of the first input sub-circuit and to the input control circuit via a second terminal of the first input sub-circuit. The first input circuit is configured to, under control of the first signal input terminal, cause a voltage of the first voltage terminal to be output to a second terminal of the first input sub-circuit and output to the pull-up node via the first terminal of the first input sub-circuit. The input control circuit is also connected to a first power supply voltage terminal and an enable signal terminal. The input control circuit is configured to pull down the potential of the second terminal of the first input sub-circuit to the potential of the first power supply voltage terminal under control of the enable signal terminal. The pull-down control circuit is connected to a pull-down node, and the pull-down control circuit is configured to control a potential of the pull-down node. The output circuit is connected to a clock signal terminal, the pull-up node, and a signal output terminal. The output circuit is configured to output a signal of the clock signal terminal to the signal output terminal under control of the pull-up node. The pull-down circuit is connected to the pull-up node, the pull-down node, the signal output terminal and the first power supply voltage terminal. The pull-down circuit is configured to pull down a potential of the pull-up node and the signal output terminal to a potential of the first power supply voltage terminal under control of the pull-down node. The second input circuit is connected to a second signal input terminal, a second voltage terminal, and the pull-up node. The second input circuit is configured to output the voltage of the second voltage terminal to the pull-up node under control of the second signal input terminal.

Optionally, an exemplary embodiment of the second input circuit comprises a second input sub-circuit. The second input circuit is connected to the pull-up node via a first terminal of the second input sub-circuit and is further connected to the input control circuit via a second terminal of the second input sub-circuit. The second input circuit is configured to, under control of the second signal input terminal, cause a voltage of the second voltage terminal to be output to the second terminal of the second input sub-circuit and output to the pull-up node via the first terminal of the first input sub-circuit. The input control circuit is further configured to pull down a potential of the second terminal of the second input sub-circuit to a potential of the first power supply voltage terminal under control of the enable signal terminal.

Optionally, an exemplary embodiment of the input control circuit comprises an input control transistor. A gate of the input control transistor is connected to the enable signal terminal, a first electrode of the input control transistor is connected to the first power supply voltage terminal, and a second electrode of the input control transistor is connected to the first input sub-circuit.

Optionally, an exemplary embodiment of in a case where the second input circuit comprises a second input sub-circuit, the second electrode of the input control transistor is further connected to the second input sub-circuit.

Optionally, an exemplary embodiment of the input control circuit comprises a first input control transistor and a second input control transistor. A gate of the first input control transistor is connected to the enable signal terminal, a first electrode of the first input control transistor is connected to the first power supply voltage terminal, and a second electrode of the first input control transistor is connected to the first input sub-circuit. A gate of the second input control transistor is connected to the enable signal terminal, a first electrode of the second input control transistor is connected to the first power supply voltage terminal, and a second electrode of the second input control transistor is connected to the second input sub-circuit.

Optionally, an exemplary embodiment of the enable signal terminal is connected to the pull-down node or the clock signal terminal.

Optionally, an exemplary embodiment of the first input sub-circuit is further connected to the first signal input terminal. The first input sub-circuit comprises a first auxiliary transistor. A gate of the first auxiliary transistor is connected to the first signal input terminal, a first electrode of the first auxiliary transistor is connected to the pull-up node, and a second electrode of the first auxiliary transistor is connected to the input control circuit.

Optionally, an exemplary embodiment of the second input sub-circuit is further connected to the second signal input terminal. The second input sub-circuit comprises a second auxiliary transistor. A gate of the second auxiliary transistor is connected to the second signal input terminal, a first electrode of the second auxiliary transistor is connected to the pull-up node, and a second electrode of the second auxiliary transistor is connected to the input control circuit.

Optionally, an exemplary embodiment of the first input circuit further comprises a first input transistor. A gate of the first input transistor is connected to the first signal input terminal, a first electrode of the first input transistor is connected to the second electrode of the first auxiliary transistor, and a second electrode of the first input transistor is connected to the first voltage terminal.

Optionally, an exemplary embodiment of the second input circuit further comprises a second input transistor. A gate of the second input transistor is connected to the second signal input terminal, a first electrode of the second input transistor is connected to the second electrode of the second auxiliary transistor, and a second electrode of the second input transistor is connected to the second voltage terminal.

Optionally, an exemplary embodiment of the output circuit comprises a driving transistor and a storage capacitor. A gate of the driving transistor is connected to the clock signal terminal, a first electrode of the driving transistor is connected to the signal output terminal, and a second electrode of the driving transistor is connected to the clock signal terminal. A terminal of the storage capacitor is connected to the gate of the driving transistor, and the other terminal of the storage capacitor is connected to the first electrode of the driving transistor.

Optionally, an exemplary embodiment of the pull-down control circuit is further connects a third power supply voltage terminal, the first power supply voltage terminal and the pull-up node. The pull-down control circuit comprises a first transistor and a second transistor. A gate and a second electrode of the first transistor are connected to the third power supply voltage terminal, and a first electrode of the first transistor is connected to the pull-down node. A gate of the second transistor is connected to the pull-up node, a first electrode of the second transistor is connected to the pull-down node, and a second electrode of the second transistor is connected to the first power supply voltage terminal. A width-to-length ratio of the second transistor is greater than that of the first transistor.

Optionally, an exemplary embodiment of the pull-down circuit comprises a third transistor and a fourth transistor. A gate of the third transistor is connected to the pull-down node, a first electrode of the third transistor is connected to the pull-up node, and a second electrode of the third transistor is connected to the first power supply voltage terminal. A gate of the fourth transistor is connected to the pull-down node, a first electrode of the fourth transistor is connected to the signal output terminal, and a second electrode of the fourth transistor is connected to the first power supply voltage terminal.

Optionally, an exemplary embodiment of the shift register unit further comprises a first reset circuit. The first reset circuit is connected to a first reset signal terminal, the pull-up node, the signal output terminal and the first power supply voltage terminal. The first reset circuit is configured to pull down potentials of the pull-up node and the signal output terminal to a potential of the first power supply voltage terminal under control of the first reset signal terminal. The first reset circuit comprises a fifth transistor and a sixth transistor. A gate of the fifth transistor is connected to the first reset signal terminal, a first electrode of the fifth transistor is connected to the pull-up node, and a second electrode of the fifth transistor is connected to the first power supply voltage terminal. A gate of the sixth transistor is connected to the first reset signal terminal, a first electrode of the sixth transistor is connected to the signal output terminal, and a second electrode of the sixth transistor is connected to the first power supply voltage terminal.

In another exemplary embodiment, there is provided a gate driving circuit comprising a plurality of cascaded shift register units of any kind as described above. A first signal input terminal of a first-stage shift register unit is connected to a first scan control terminal. A signal output terminal of a previous-stage shift register unit except for the first-stage shift register unit is connected to a first signal input terminal of a next-stage shift register unit. A signal output terminal of the next-stage shift register unit except for the last-stage shift register unit is connected to a second signal input terminal of the previous-stage shift register unit. A second signal input terminal of the last-stage shift register unit is connected to a second scan control terminal.

In a further exemplary embodiment, there is provided a display device comprising the gate driving circuit as described above.

In a further exemplary embodiment, there is provided a method for driving the aforesaid shift register unit, the method comprising, within an image frame: in a first phase, outputting a voltage of the first voltage terminal by the first input circuit to the pull-up node under control of the first signal input terminal, in a second phase, outputting a signal of the clock signal terminal by the output circuit to the signal output terminal under control of the pull-up node, in a third phase, outputting the voltage of the second voltage terminal by the second input circuit to the pull-up node under control of the second signal input terminal; controlling the potential of the pull-down node by the pull-down control circuit, so that the pull-down circuit pulls down the potential of the pull-up node and the signal output terminal to the potential of the first power supply voltage terminal under control of the pull-down node. In at least one time period after the second phase and before the start of a next image frame, the input control circuit pulls down the potential of the second terminal of the first input sub-circuit in the first input circuit to the potential of the first power supply voltage terminal under control of the enable signal terminal.

Optionally, in an exemplary embodiment in which the enable signal terminal is connected to the clock signal terminal, in the second phase, the method comprises: the input control circuit pulls down the potential of the second terminal of the first input sub-circuit to the potential of the first power supply voltage terminal under control of the clock signal terminal.

Optionally, in an exemplary embodiment the clock signal has a 50% duty cycle, wherein the first, second, and third phases have a duration equal to a half of a period of the clock signal.

Exemplary embodiments of the present disclosure provide a shift register unit and a driving method thereof, a gate driving circuit, and a display device. As can be seen from the above, in the shift register unit, although the first input circuit is, through the first voltage terminal, connected to the second power supply voltage terminal capable of outputting a constant high level, the input control circuit may pull down the potential of a terminal of the first input sub-circuit in the first input circuit that is connected to the input control circuit to the potential of the first power supply voltage terminal. Therefore, the transistor in the first input sub-circuit that is connected to the pull-up node will not be subjected to an effect of a constant high level output by the second power supply voltage terminal for a long time, and then will not generate a negative bias. In this case, in the output phase of the shift register unit, the output circuit can be normally turned on, and maintains a normal turn-on time, thereby outputting a pulse signal output from the clock signal terminal as a gate scan signal, to a gate line connected with the signal output terminal of the shift register unit, to make the gate line ON.

BRIEF DESCRIPTION OF THE DRAWINGS

In order to more clearly illustrate the technical solutions in the exemplary embodiments of the present disclosure, a brief description will be presented below with reference to figures. Obviously, the figures in the following description are only some embodiments of the present disclosure.

DETAILED DESCRIPTION

The technical solutions in the embodiments of the present disclosure will be clearly and completely described below with reference to figures in the exemplary embodiments of the present disclosure. It is apparent that the described exemplary embodiments are only a part of the embodiments of the present disclosure, and not all embodiments. All other embodiments obtained by those of ordinary skill in the art based on the embodiments of the present disclosure without making inventive efforts fall within the protection scope of the present disclosure.

In the following, the terms "first", "second" and the like are used for descriptive purposes only and cannot be construed as indicating or implying a relative importance or implicitly indicating the number of technical features indicated. Thus, features defined with "first", "second", etc. may explicitly or implicitly include one or more features. In the description of the embodiments of the present disclosure, "a plurality of" means two or more unless otherwise stated.

The solution according to an embodiment of the present disclosure is employed to solve a problem that some of transistors in a shift register unit are in a biased state for a long time, causing abnormality of a gate scan signal outputted by the shift register unit. Particularly when the above transistors are semiconductor oxide transistors, the structure provided by the present disclosure may be used to more effectively suppress the occurrence of transistor bias.

Figure 1:
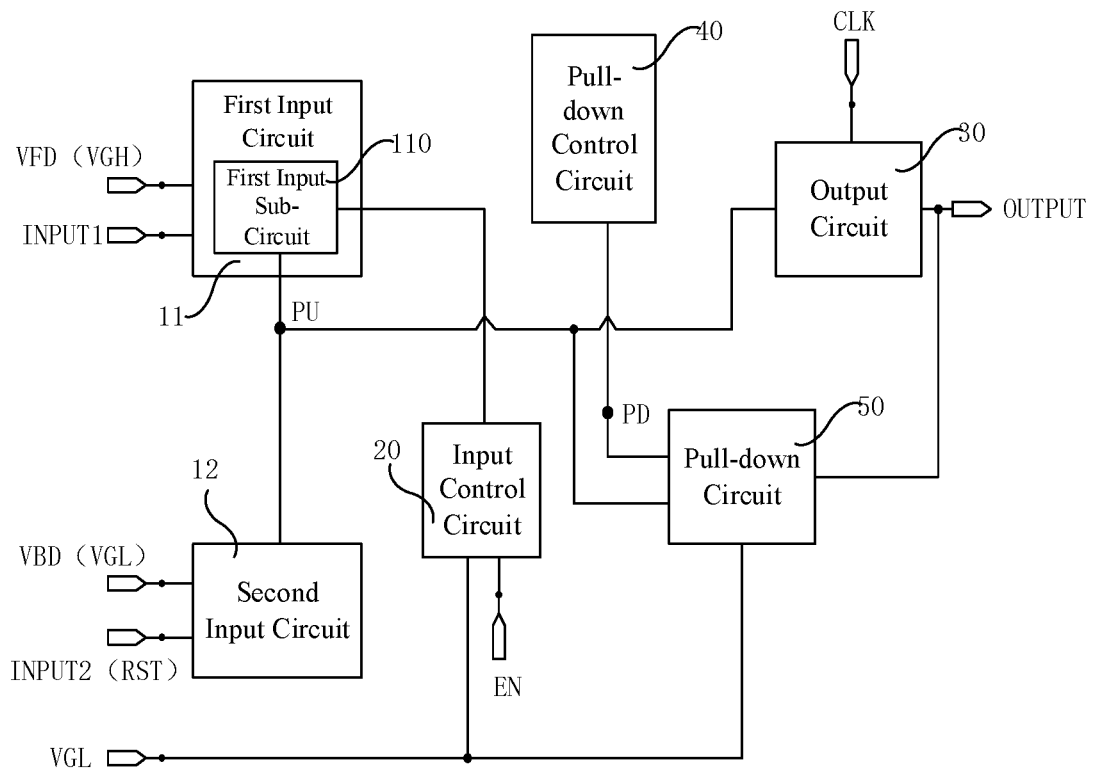
FIG. 1 is a schematic structural diagram of a shift register unit according to an exemplary embodiment.

FIG. 1 shows a shift register unit according to an exemplary embodiment. As shown in FIG. 1, the shift register unit comprises a first input circuit 11, a second input circuit 12, an input control circuit 20, an output circuit 30, a pull-down control circuit 40, and a pull-down circuit 50.

The first input circuit 11 is connected to a first signal input terminal INPUT1, a pull-up node PU, a first voltage terminal VFD and an input control circuit 20. The first input circuit 11 is configured to output the voltage of the first voltage terminal VFD to the pull-up node PU under control of the first signal input terminal INPUT1.

In this exemplary embodiment, the first input circuit 11 comprises a first input sub-circuit 110 and is connected to the pull-up node PU via a first terminal of the first input sub-circuit 110 and input to the control circuit 20 via a second terminal of the first input sub-circuit 110. Under control of the first signal input terminal INPUT1, the voltage of the first voltage terminal VFD is first output to the second terminal of the first input sub-circuit 110, namely, the terminal connected to the input control circuit 20, and then output to the pull-up node PU via the first terminal of the first input sub-circuit 110.

The input control circuit 20 is also connected to a first power supply voltage terminal VGL and an enable signal terminal EN. The input control circuit 20 is configured to pull down the potential of one terminal of the first input sub-circuit 110 connected to the input control circuit 20 to the potential of the first power supply voltage terminal VGL under control of the enable signal terminal EN.

The enable signal terminal EN may be connected to the pull-down node PD. Alternatively, the enable signal terminal EN may be connected to a clock signal terminal CLK.

It would be appreciated that in some exemplary embodiments of the present disclosure, the first power supply voltage terminal VGL may output a constant low level or get grounded.

In some exemplary embodiments, the pull-down control circuit 40 is connected to the pull-down node PD, and the pull-down control circuit 40 is configured to control the potential of the pull-down node PD.

The output circuit 30 is connected to the clock signal terminal CLK, the pull-up node PU and a signal output terminal OUTPUT. The output circuit OUTPUT may output the signal of the clock signal terminal CLK to the signal output terminal OUTPUT under control of the pull-up node PU.

The pull-down circuit 50 is connected to the pull-up node PU, the pull-down node PD, the signal output terminal OUTPUT, and the first power supply voltage terminal VGL. The pull-down circuit 50 is configured to pull down the potential of the pull-up node PU and the signal output terminal OUTPUT to the potential of the first power supply voltage terminal VGL under control of the pull-down node PD.

The second input circuit 12 is connected to the second signal input terminal INPUT2, the second voltage terminal VBD, and the pull-up node PU. The second input circuit 12 is configured to output the voltage of the second voltage terminal VBD to the pull-up node PU under control of the second signal input terminal INPUT2.

The second voltage terminal VBD may be connected to the first power supply voltage terminal VGL, and the second signal input terminal INPUT2 may receive a reset signal RST. At this time, the low level output by the first power supply voltage terminal VGL may be transmitted to the pull-up node PU through the second input circuit 12 to reset the pull-up node PU.

It may be appreciated that in the case of bidirectional scanning, the levels of the first voltage terminal VFD and the second voltage terminal VBD can be switched between high and low levels as the scanning direction changes.

In this case, the second input circuit 12 may be used to reset the shift register unit. Optionally, the second signal input terminal INPUT2 of the shift register unit may be connected to the signal output terminal OUTPUT of a next-stage shift register unit to, through the signal output terminal OUTPUT of the next-stage shift register unit, provide the reset signal RST to the second signal input terminal INPUT2 of the second input circuit 12 of a previous-stage shift register unit thereof.

Figure 2:
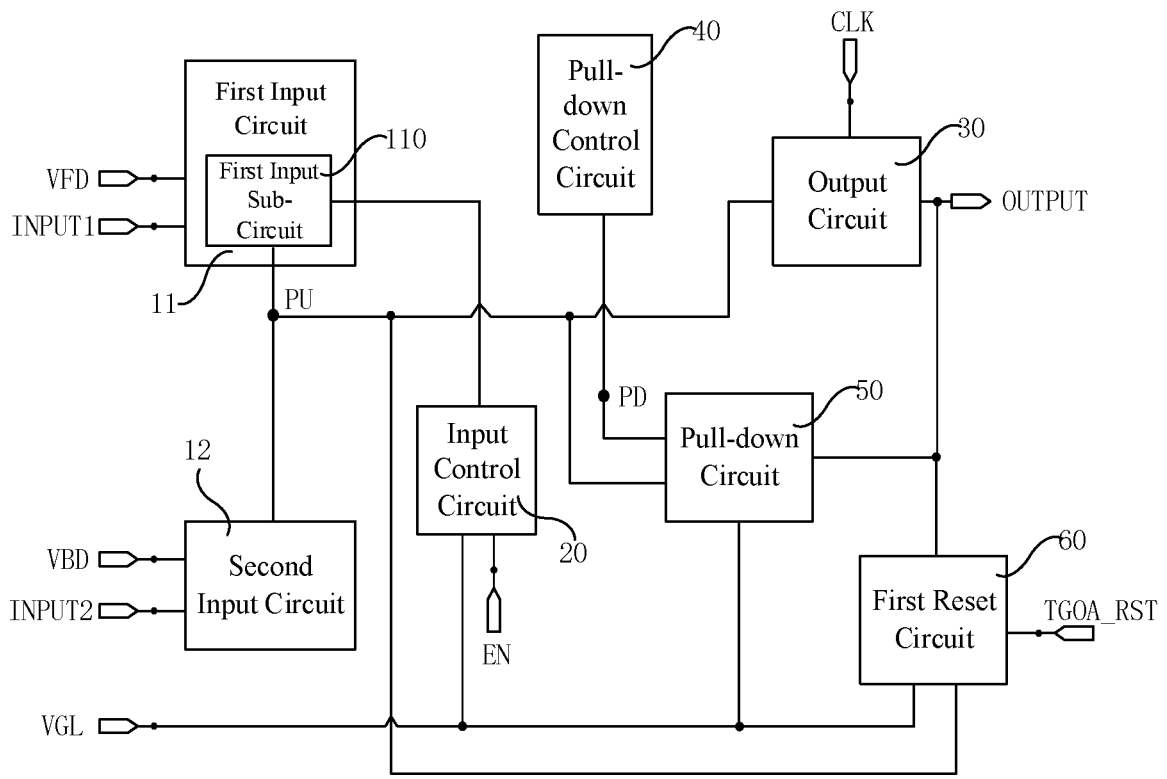
FIG. 2 is a schematic structural diagram of another shift register unit according to an exemplary embodiment.

In order to improve the reset effect of the pull-up node PU and the signal output terminal OUTPUT in the shift register unit, optionally, the shift register unit further comprises a separate reset circuit. FIG. 2 illustrates another shift register unit according to an embodiment of the present disclosure. The respective circuits in FIG. 2 are the same as those shown in FIG. 1, except that the shift register unit further comprises a first reset circuit 60.

The first reset circuit 60 is connected to the first reset signal terminal TGOA_RST, the pull-up node PU, the signal output terminal OUTPUT and the first power supply voltage terminal VGL. The first reset circuit 60 is configured to pull down the potential of the pull-up node PU and the signal output terminal OUTPUT to the potential of the first power supply voltage terminal VGL under control of the first reset signal terminal TGOA_RST. After completing the scanning of an image frame, all the shift register units may simultaneously receive a reset signal through respective first reset signal terminals TGOA_RST to simultaneously reset the pull-up nodes PU therein and their own signal output terminals OUTPUT.

In some exemplary embodiments, the first voltage terminal VFD may be connected to the second power supply voltage terminal VGH. The second power supply voltage terminal VGH may output a constant high level. In this case, under control of the first signal input terminal INPUT1, the high level outputted by the second power supply voltage terminal VGH may be transmitted to the pull-up node PU through the first input circuit 11 to charge the pull-up node PU.

In one exemplary embodiment, the first voltage terminal VFD may be connected to the second power supply voltage terminal VGH, and the second voltage terminal VBD is connected to the first power supply voltage terminal VGL. Although the first input circuit 11 is connected, through the first voltage terminal VFD, to the second power supply voltage terminal VGH which is capable of outputting a constant high level, it can be seen from the above that the input control circuit 20 may pull down the potential of the terminal of the first input sub-circuit 110 of the first input circuit 11 connected with the input control circuit 20 to the potential of the first power supply voltage terminal VGL. Therefore, the transistor in the first input sub-circuit 110 connected to the pull-up node PU will not be subjected to an effect of a constant high level output by the second power supply voltage terminal VGH for a long time, and then will not generate a negative bias. In this case, in the output phase of the shift register unit, the output circuit 30 can be normally turned on, and maintains a normal turn-on time, thereby outputting a pulse signal output from the clock signal terminal CLK, as a gate scan signal, to a gate line connected with the signal output terminal OUTPUT of the shift register unit, to make the gate line ON.

In another exemplary embodiment, it is possible to allow the first voltage terminal VFD to connect with the second power supply voltage terminal VGH, the second voltage terminal VBD to connect with the first power supply voltage terminal VGL, and the second signal input terminal INPUT2 to receive a reset signal. In this case, the first input circuit 11 may charge the pull-up node PU, and the second input circuit 12 may reset the pull-up node PU. When a plurality of shift register units form a cascade structure, the signal output terminal OUTPUT of a next-stage shift register unit may be connected to the second signal input terminal INPUT2 of a previous-stage shift register unit thereof. In this case, the gate driving circuit composed of the plurality of cascaded shift register units scans the gate lines on the display panel line by line from top to bottom in a forward scanning mode.

During the forward scanning, the first voltage terminal VFD connected to the first input circuit 11 is connected to the second power supply voltage terminal VGH. As mentioned earlier, this might cause a threshold voltage offset of the transistor, thereby causing problems when the scanning mode switches from the forward scanning mode to the reverse scanning mode.

Figure 3:
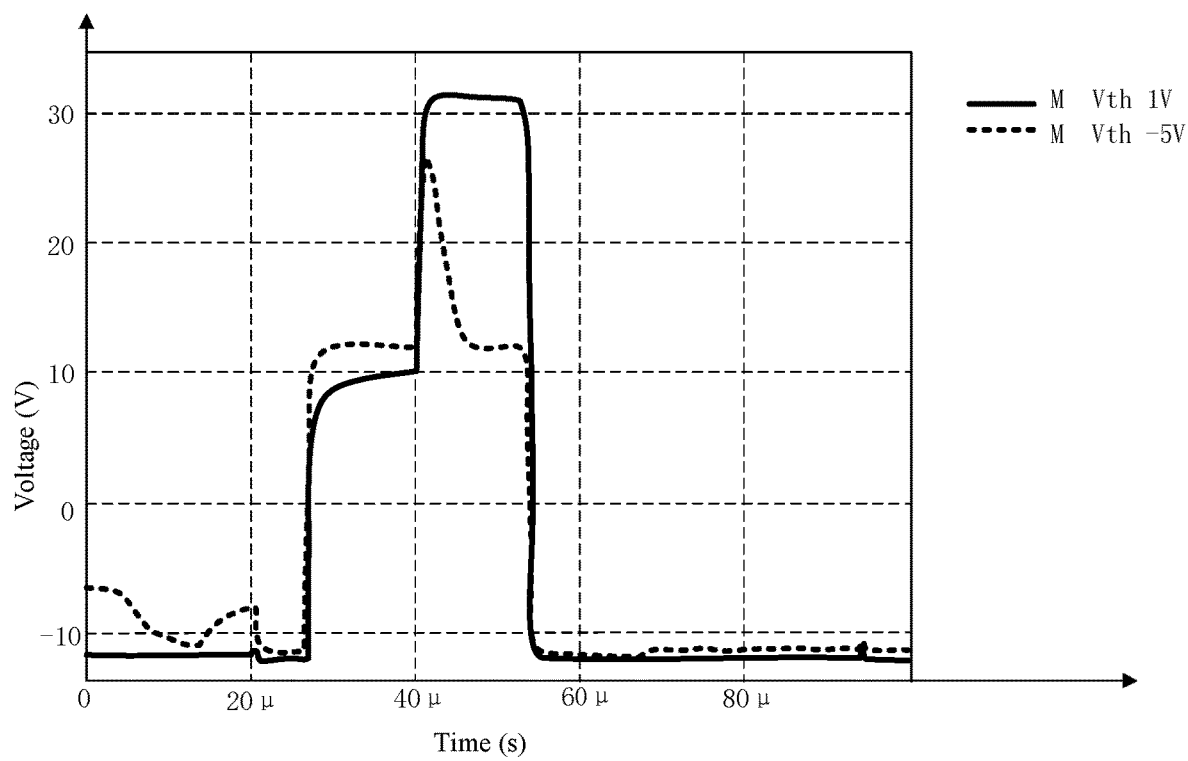
FIG. 3 is a waveform diagram of a pull-up node when a threshold voltage of a transistor in a shift register unit changes in an exemplary embodiment.

FIG. 3 shows comparison of waveforms of the pull-up node when the threshold voltage of a transistor in the shift register unit changes. In the relevant technology, if a transistor M of the first input circuit is subjected to a constant high level output from the second power supply voltage terminal VGH for a long time, its threshold voltage may get offset, for example, its threshold voltage Vth may get offset from the normal 1V in a negative direction to −5V. Upon switching from the forward scanning mode to the reverse scanning mode, the first voltage terminal VFD is changed to connect with the first power supply voltage terminal VGL, and leakage of the pull-up node PU to the first power supply voltage terminal VGL will occur through the transistor M. At this time, due to the leakage of the pull-up node PU, the pull-up node PU would not maintain a charging state during the reverse scanning process, thereby causing abnormality in the output waveform, as shown by the dotted-line waveform in FIG. 3, especially as show in the 40 µs-60 µs interval. In this case, the output circuit 30 connected to the pull-up node PU will not be normally turned on, and the phenomenon that there is no gate scan signal output on the signal output terminal OUTPUT will occur.

The shift register unit according to an exemplary embodiment may reduce, through the input control circuit 20, a probability that the threshold voltage of the transistor in the first input circuit (e.g., the first input sub-circuit 110) gets offset, thereby reducing the probability of leakage of the pull-up node PU, and enabling PU to keep outputting a normal waveform. As shown by the solid-line waveform in FIG. 3, for example, in the 40 µs-60 µs interval, the potential of the pull-up node PU is substantially stabilized at a high potential, so that it is possible to ensure the normal turn-on of the output circuit 30 and the normal output of the gate scan signal.

Figure 4:
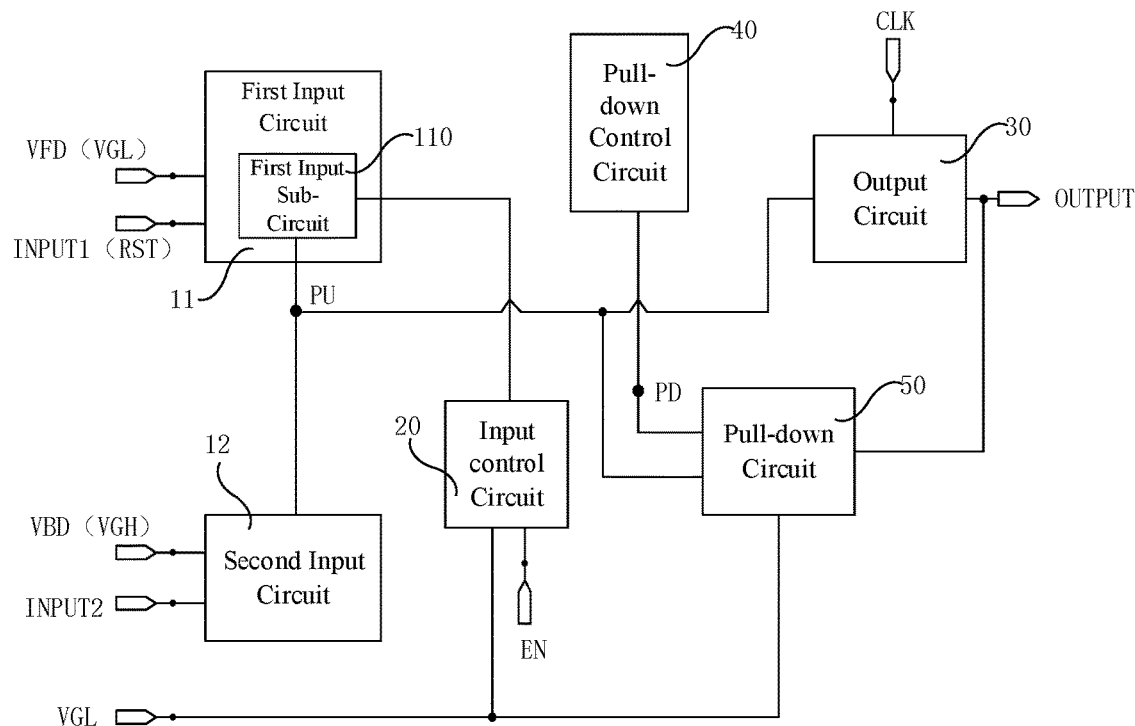
FIG. 4 is a schematic structural diagram of a further shift register unit according to an exemplary embodiment.

FIG. 4 shows a further shift register unit according to an exemplary embodiment. The circuits of the shift register unit are substantially the same as those in FIG. 1, except that the shift register unit is used for reverse scanning and therefore the signal terminals connected by its first input circuit and second input circuit are different.

As shown in FIG. 4, when the gate driving circuit adopts the reverse scanning mode to scan the gate lines on the display panel line by line from bottom to top, the first voltage terminal VFD may be connected to the first power supply voltage terminal VGL, the second voltage terminal VBD may be connected to the second power supply voltage terminal VGH, and the first signal input terminal INPUT1 may receive a reset signal RST. In this case, the second input circuit 12 may charge the pull-up node PU, and the first input circuit 11 may reset the pull-up node PU.

Thus, upon switching from the forward scanning mode to the reverse scanning mode, the first voltage terminal VFD connected to the first input circuit 11 changes from connection with the second power supply voltage terminal VGH to connection with the first power supply voltage terminal VGL that outputs a low level. However, as known from the above, in the forward scanning process, under the action of the input control circuit 20, the transistor in the first input sub-circuit 110 of the first input circuit 11 will not be subjected to an effect of a constant high level output by the second power supply voltage terminal VGH for a long time and then will not generate a negative bias, thereby avoiding or alleviating the problem of threshold voltage offset. Therefore, after switching from the forward scanning mode to the reverse scanning mode, no leakage of the pull-up node PU to the first power supply voltage terminal VGL will occur via a transistor in the first input sub-circuit 110 connected with the pull-up node. Since the leakage of the pull-up node PU can be avoided, the pull-up node PU may maintain the charging state during the reverse scanning process, thereby ensuring that the output circuit 30 connected to the pull-up node PU is normally turned on, and the signal output terminal OUTPUT normally outputs the gate scan signal.

Similarly, in the reverse scanning process, in order to reduce the probability that the threshold voltage of a transistor in the second input circuit 12 gets offset, it is necessary to reduce the probability of leakage of the pull-up node PU after the reverse scanning mode is switched to the forward scanning mode.

Figure 5:
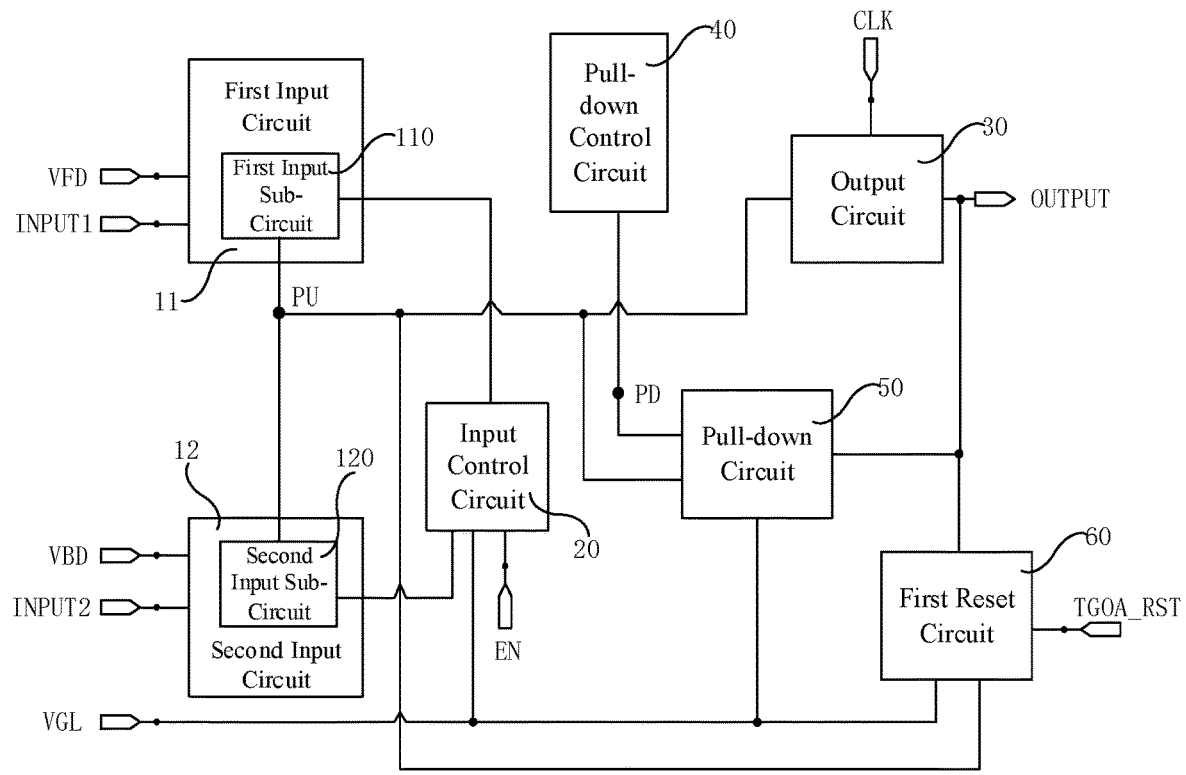
FIG. 5 is a schematic structural diagram of a further shift register unit according to an exemplary embodiment.

FIG. 5 shows a further shift register unit according to an exemplary embodiment. The shift register unit differs from the shift register unit shown in FIG. 2 in that the second input circuit 12 optionally comprises a second input sub-circuit 120.

As shown in FIG. 5, the second input circuit 12 is connected to the pull-up node PU via the first terminal of the second input sub-circuit 120 and is connected to the input control circuit 20 via the second terminal of the second input sub-circuit 120. Under control of the second signal input terminal INPUT2, the potential of the second terminal of the second input sub-circuit 120, namely, the terminal connected to the input control circuit 20 may be pulled to the potential of the second voltage terminal VBD, and the voltage of the second voltage terminal VBD may be output to the pull-up node PU. The input control circuit 20 is further configured to pull down the potential of one terminal of the second input sub-circuit 120 connected to the input control circuit 20 to the potential of the first power supply voltage terminal VGL under control of the enable signal terminal EN.

In this case, during the reverse scanning process, the input control circuit 20 may pull down the potential of one terminal of the second input sub-circuit 120 connected to the input control circuit 20 to the potential of the first power supply voltage terminal VGL. Therefore, the transistor in the second input sub-circuit 120 connected to the pull-up node PU will not be subjected to an effect of a constant high level output by the second power supply voltage terminal VGH for a long time, and then will not generate a negative bias. In this way, it is possible to reduce the probability that the threshold voltage of the transistor in the second input sub-circuit 120 gets offset, thereby avoiding leakage of the pull-up node PU to the first power supply voltage terminal VGL when the second voltage terminal VBD connected to the second input circuit 12 is connected to the first power supply voltage terminal VGL in the case that the reverse scanning mode switches to the forward scanning mode.

Figure 6:
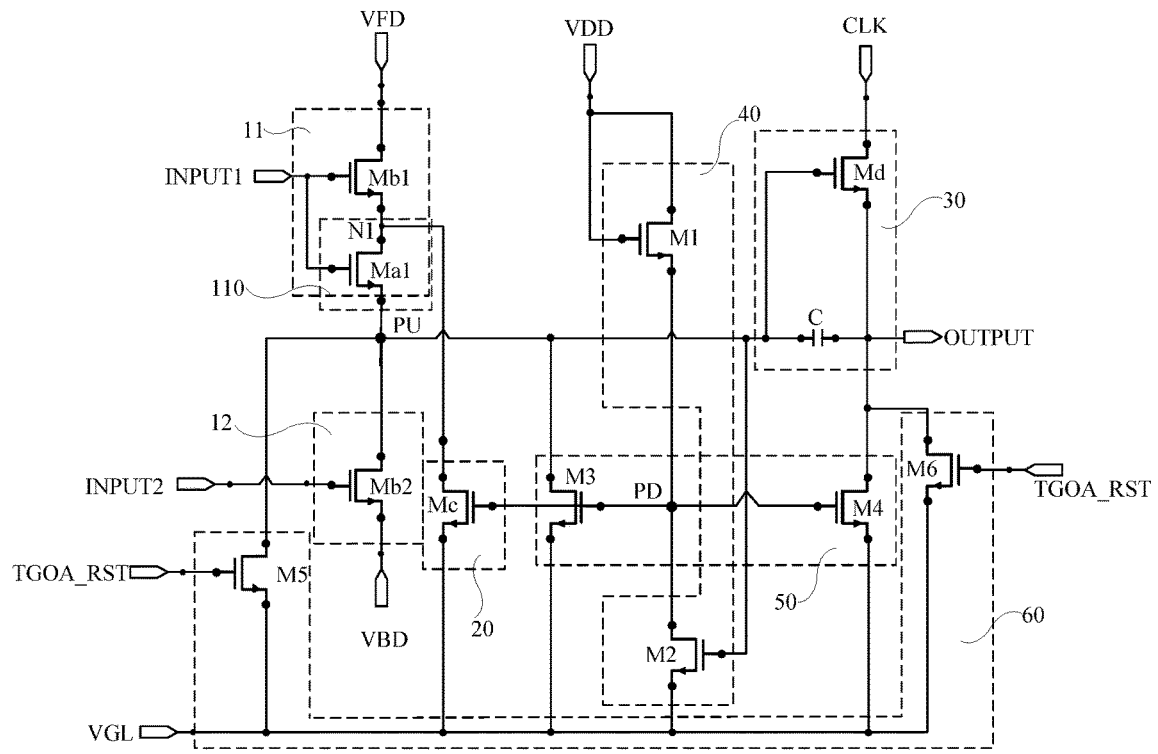
FIG. 6 is a circuit diagram of a shift register unit according to an exemplary embodiment.

FIG. 6 shows a circuit structure of a shift register unit according to an exemplary embodiment. As shown in FIG. 6, the input control circuit 20 comprises an input control transistor Mc. A gate of the input control transistor Mc is connected to the enable signal terminal EN (wherein the enable signal terminal EN is connected to the pull-down node PD), a first electrode thereof is connected to the first power supply voltage terminal VGL, and a second electrode thereof is connected to the first input sub-circuit 110.

The first input sub-circuit 110 is also connected to the first signal input terminal INPUT1. In this case, the first input sub-circuit 110 comprises a first auxiliary transistor Ma1. A gate of the first auxiliary transistor Ma1 is connected to the first signal input terminal INPUT1, a first electrode thereof is connected to the pull-up node PU, and a second electrode thereof is connected to the input control circuit 20. When the structure of the input control circuit 20 is as described above, the second electrode of the first auxiliary transistor Ma1 is connected to the second electrode of the input control transistor Mc.

In addition, the first input circuit 11 further comprises a first input transistor Mb1. A gate of the first input transistor Mb1 is connected to the first signal input terminal INPUT1, a first electrode thereof is connected to the second electrode of the first auxiliary transistor Ma1, and a second electrode thereof is connected to the first voltage terminal VFD.

The output circuit 30 comprises a driving transistor Md and a storage capacitor C. A gate of the driving transistor Md is connected to the pull-up node PU, a first electrode thereof is connected to the signal output terminal OUTPUT, and a second electrode thereof is connected to the clock signal terminal CLK. A terminal of the storage capacitor C is connected to the gate of the driving transistor Md, and the other terminal is connected to the first electrode of the driving transistor Md.

The pull-down control circuit 40 is also connected to a third power supply voltage terminal VDD, the first power supply voltage terminal VGL, and the pull-up node PU.

The pull-down control circuit 40 comprises a first transistor M1 and a second transistor M2. A gate and a second electrode of the first transistor M1 are connected to the third power supply voltage terminal VDD, and a first electrode thereof is connected to the pull-down node PD. A gate of the second transistor M2 is connected to the pull-up node PU, a first electrode thereof is connected to the pull-down node PD, and a second electrode thereof is connected to the first power supply voltage terminal VGL.

A width-to-length ratio of the second transistor M2 is greater than that of the first transistor M1 to ensure that the second transistor M2 is turned on in preference to the first transistor M1, so that when the pull-up node PU is charged, the potential of the pull-down node PD is pulled down to the potential of the first power supply voltage terminal VGL through the second transistor M2.

The pull-down circuit 50 comprises a third transistor M3 and a fourth transistor M4. A gate of the third transistor M3 is connected to the pull-down node PD, a first electrode thereof is connected to the pull-up node PU, and a second electrode thereof is connected to the first power supply voltage terminal VGL. A gate of the fourth transistor M4 is connected to the pull-down node PD, a first electrode thereof is connected to the signal output terminal OUTPUT, and a second electrode thereof is connected to the first power supply voltage terminal VGL.

The second input circuit 12 further comprises a second input transistor Mb2. A gate of the second input transistor Mb2 is connected to the second signal input terminal INPUT2, a first electrode thereof is connected to the pull-up node PU, and a second electrode thereof is connected to the second voltage terminal VBD.

In this exemplary embodiment, when the shift register unit further comprises the first reset circuit 60, the first reset circuit 60 comprises a fifth transistor M5 and a sixth transistor M6. A gate of the fifth transistor M5 is connected to a first reset signal terminal TGOA-RST, a first electrode thereof is connected to the pull-up node PU, and a second electrode thereof is connected to the first power supply voltage terminal VGL. A gate of the sixth transistor M6 is connected to the first reset signal terminal TGOA-RST, a first electrode thereof is connected to the signal output terminal OUTPUT, and a second electrode thereof is connected to the first power supply voltage terminal VGL.

It would be appreciated that in various embodiments, although the transistor is illustrated and described as an N-type transistor, a P-type transistor is possible. The first electrode may be a source, and the second electrode is a drain; or the first electrode is a drain, and the second electrode is a source. In the case of the P-type transistor, the gate-on voltage has a low level, and the gate-off voltage has a high level. In various exemplary embodiments, the transistors may take the form of, for example, thin film transistors, which are typically fabricated such that their first and second electrodes are used interchangeably.

In one exemplary embodiment, the structure shown in FIG. 6 may be used for forward scanning. At this time, the first voltage terminal VFD is connected to the second power supply voltage terminal VGH. The first input transistor Mb1 and the first auxiliary transistor Ma1 are connected in series. Although the first input transistor Mb1 negatively shifts when being subjected to the effect of the high level output by the second power supply voltage terminal VGH for a long time, the potential of the second electrode of the first auxiliary transistor Ma1 connected to the pull-up node PU, namely, the potential of the node N1 is pulled down to the potential of the first power supply voltage terminal VGL under the action of the input control transistor Mc. As such, the first auxiliary transistor Ma1 will not be in a negative biased state due to long time connection with a high level, so that the first auxiliary transistor Ma1 can be turned off in time after the completion of charging of the pull-up node PU, which allows avoiding an abnormal phenomenon that after the shift register unit outputs the gate scan signal and the pull-up node PU resets, the pull-up node PU is still in a charging state and in turn makes the output circuit 30 still on, and accordingly avoiding an abnormal phenomenon of multiple outputs at the signal output terminal OUTPUT of the shift register unit.

Figure 7:
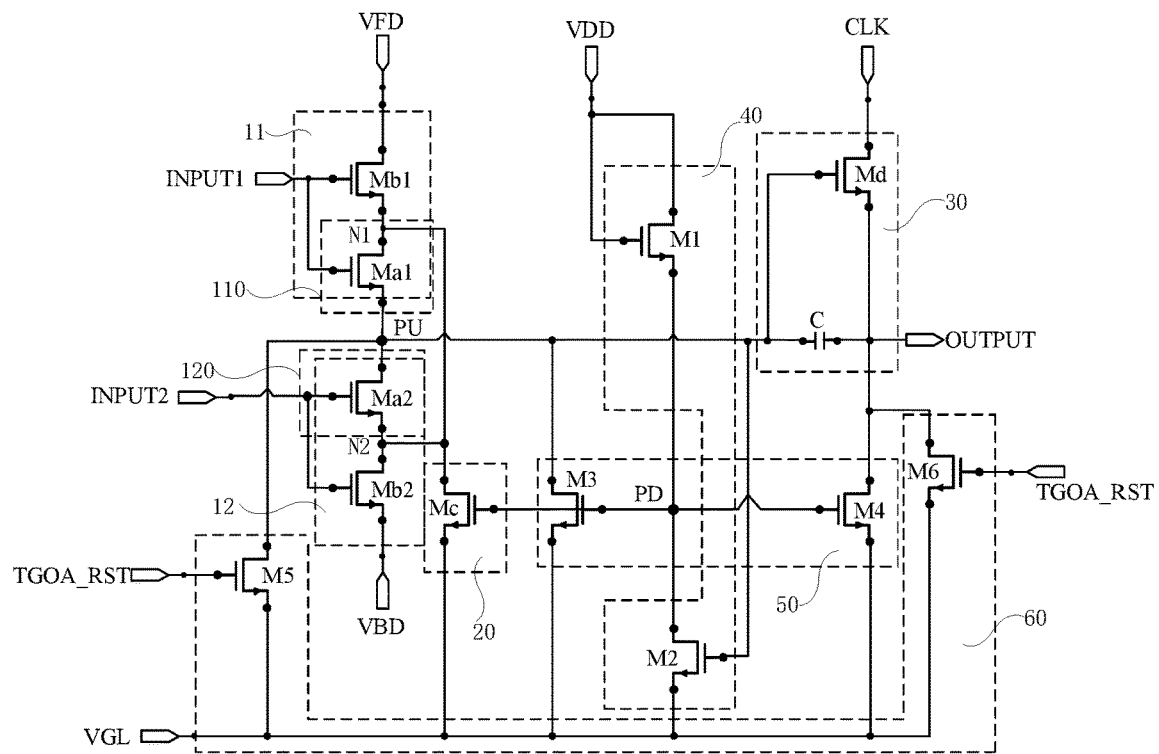
FIG. 7 is a schematic circuit diagram of another shift register unit according to an exemplary embodiment.

FIG. 7 shows a circuit structure of another shift register unit according to an exemplary embodiment. The shift register unit differs from the shift register unit shown in FIG. 6 in that the second input circuit 12 further comprises a second input sub-circuit 120.

As shown in FIG. 7, the second input sub-circuit 120 is connected to the input control transistor Mc and the pull-up node PU.

The second input sub-circuit 120 is also connected to the second signal input terminal INPUT2 and the second input transistor Mb2. That is, the second input sub-circuit 120 is inserted between the second input transistor Mb2 and the pull-up node PU. In one embodiment, the second input sub-circuit 120 comprises a second auxiliary transistor Ma2. A gate of the second auxiliary transistor Ma2 is connected to the second signal input terminal INPUT2, a first electrode thereof is connected to the pull-up node PU, and a second electrode thereof is connected to the first electrode of the second input transistor Mb2 in the input control circuit 20. When the structure of the input control circuit 20 is as described above, the second electrode of the second auxiliary transistor Ma2 is connected to the second electrode of the input control transistor Mc.

As shown in FIG. 7, during the forward scanning, the first voltage terminal VFD is connected to the second power supply voltage terminal VGH. The first input transistor Mb1 (i.e., the transistor M in FIG. 3) will shift negatively when being subjected to the effect of the high level output by the second power supply voltage terminal VGH for a long time, which will lead to the threshold voltage offset. However, as known from the above, under the action of the input control transistor MC, the first auxiliary transistor Ma1 will not shift negatively as stated above, so the probability that its threshold voltage gets offset is also small.

In this case, when switching from the forward scanning mode to the reverse scanning mode, the first voltage terminal VFD is changed to be connected to the first power supply voltage terminal VGL, and the second voltage terminal VBD is changed to be connected to the second power supply voltage terminal VGH. When it is necessary to charge the pull-up node PU through the second input transistor Mb2 and the second auxiliary transistor Ma2 which are connected in series, the first auxiliary transistor Ma1 is in an off state because the threshold voltage does not get offset, thereby ensuring that no leakage of the pull-up node PU to the first power supply voltage terminal VGL will occur via the first auxiliary transistor Ma1.

Similarly, in the reverse scanning process, the second voltage terminal VBD is connected to the second power supply voltage terminal VGH. Although the second input transistor Mb2 will shift negatively when being subjected to the effect of the high level output by the second power supply voltage terminal VGH for a long time, the potential of the second electrode of the second auxiliary transistor Ma2 connected to the pull-up node PU, namely, the potential of the node N2 is pulled down to the potential of the first power supply voltage terminal VGL under the action of the input control transistor Mc. In this way, the second auxiliary transistor Ma2 will not be in the negative biased state due to long time connection with a high level, and at this time the probability that the threshold voltage Vth of the second auxiliary transistor Ma2 is biased is small.

In this case, upon switching from the reverse scanning mode to the forward scanning mode, the second voltage terminal VBD is changed to be connected to the first power supply voltage terminal VGL, and the first voltage terminal VFD is changed to be connected to the second power supply voltage terminal VGH. When it is necessary to charge the pull-up node PU through the first input transistor Mb1 and the first auxiliary transistor Ma1 which are connected in series, the second auxiliary transistor Ma2 is in an off state because the threshold voltage does not get offset, thereby ensuring that leakage of the pull-up node PU to the first power supply voltage terminal VGL will not occur via the second auxiliary transistor Ma2.

In particular, when the above transistor is a semiconductor oxide transistor, the threshold voltage is more likely to get offset. The occurrence of the above-described threshold voltage offset can be more effectively suppressed by employing the structure provided by the embodiment of the present disclosure.

It should be appreciated that the above exemplary embodiment has been described by taking an example in which the enable signal terminal EN connected to the gate of the input control transistor Mc is connected to the pull-down node PD. Since the pull-down node PD is required to maintain a constant level, for example, a constant high level, for a long time when controlling the pull-down circuit to pull down the pull-up node PU and the signal output terminal OUTPUT, the gate of the input control transistor Mc may be subjected to a high level for a long time, which may cause a forward bias.

Figure 8:
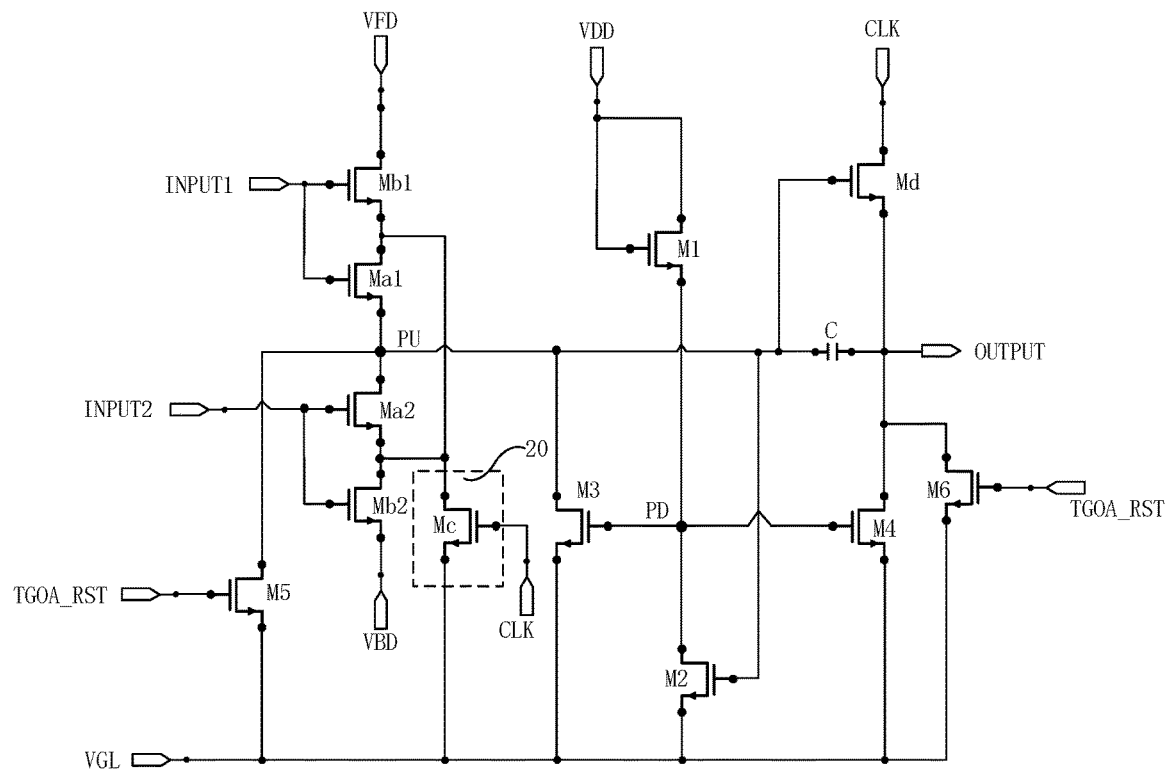
FIG. 8 is a schematic circuit diagram of a further shift register unit according to an exemplary embodiment.

FIG. 8 shows a circuit structure of a further shift register unit according to an exemplary embodiment. The shift register unit differs from the shift register unit of FIG. 7 in that the gate of the input control transistor Mc is connected to the clock signal terminal CLK, i.e., the above-mentioned enable signal terminal EN is connected to the clock signal terminal CLK.

Figure 9:
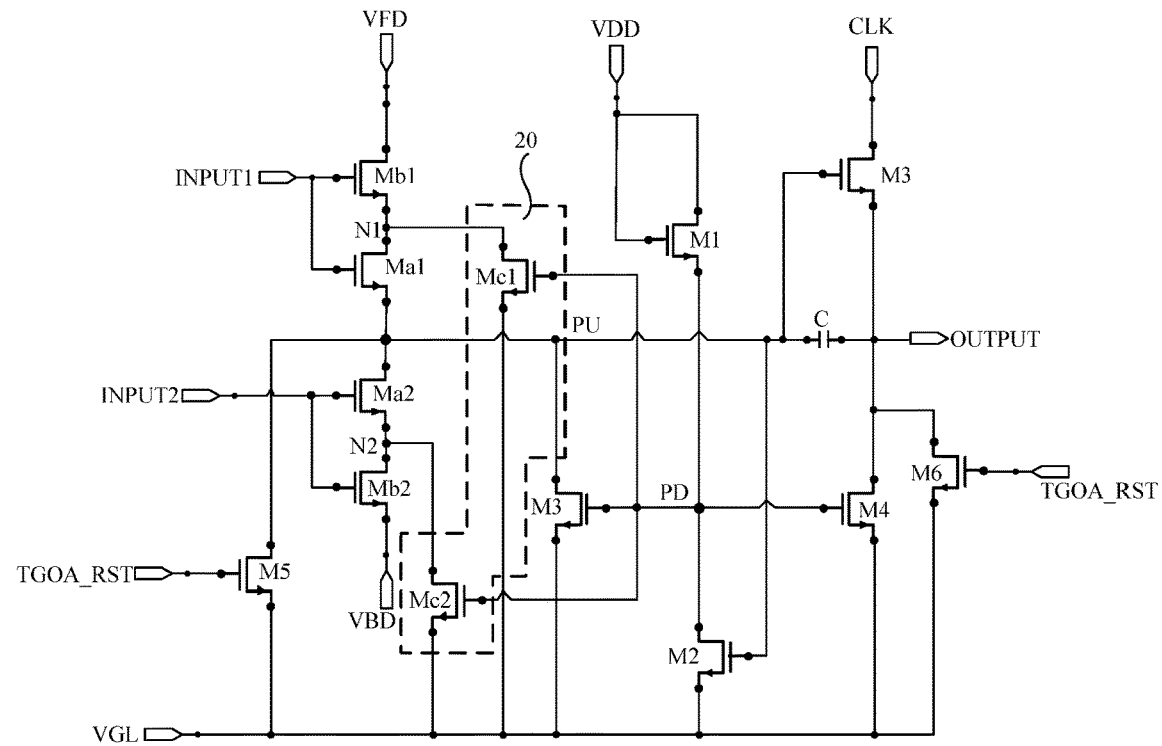
FIG. 9 is a schematic circuit diagram of a further shift register unit according to an exemplary embodiment.

Since the level of the clock signal CLK periodically changes, it may avoid or alleviate a problem that when the input control transistor Mc is subjected to a forward bias, its threshold voltage may get offset FIG. 9 shows a circuit structure of a further shift register unit according to an exemplary embodiment. This shift register unit differs from the shift register unit in FIG. 7 in the circuit structure of the input control circuit 20.

As shown in FIG. 9, the input control circuit 20 comprises a first input control transistor Mc1 and a second input control transistor Mc2. The first input control transistor Mc1 and the second input control transistor Mc2 are used to control the first input sub-circuit and the second input sub-circuit, respectively.

A gate of the first input control transistor Mc1 is connected to the enable signal terminal EN, a first electrode thereof is connected to the first power supply voltage terminal VGL, and a second electrode thereof is connected to the first input sub-circuit 110. When the structure of the first input sub-circuit 110 is as described above, the second electrode of the first input control transistor Mc1 is connected to the second electrode of the first auxiliary transistor Ma1.

In addition, a gate of the second input control transistor Mc2 is connected to the enable signal terminal EN, a first electrode thereof is connected to the first power supply voltage terminal VGL, and a second electrode thereof is connected to the second input sub-circuit 120. When the structure of the second input sub-circuit 120 is as described above, the second electrode of the second input control transistor Mc2 is connected to the second electrode of the second auxiliary transistor Ma2.

In this case, the potential of the second electrode of the first auxiliary transistor Ma1, that is, the potential of the node N1, may be pulled down to the potential of the first power supply voltage terminal VGL through the first input control transistor Mc1. As such, during the forward scanning process, the case that the first auxiliary transistor Ma1 is subjected to a negative bias for a long time is avoided, which otherwise will make the threshold voltage the first auxiliary transistor Ma1 get offset, thereby causing leakage of the pull-up node PU.

Alternatively, the potential of the second electrode of the second auxiliary transistor Ma2, that is, the potential of the node N2, may be pulled down to the potential of the first power supply voltage terminal VGL through the second input control transistor Mc2. As such, during the reverse scanning process, the case that the second auxiliary transistor Ma2 is subjected to a negative bias for a long time is avoided, which otherwise will make its threshold voltage get offset, thereby causing leakage of the pull-up node PU.

Although the enable signal terminal EN is connected to the pull-down node PD in FIG. 9, it may be appreciated that the enable signal terminal EN may also be connected to the clock signal terminal CLK or any other suitable signal terminal.

Figure 10:
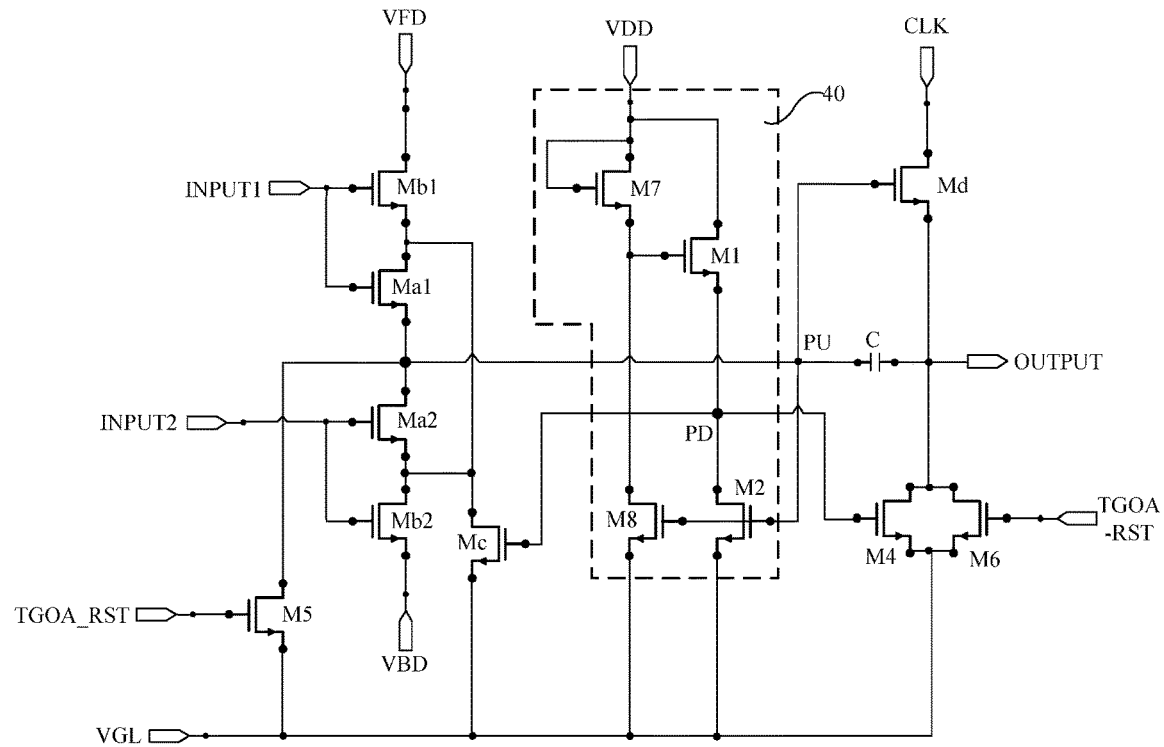
FIG. 10 is a circuit diagram of a further shift register unit according to an exemplary embodiment.

FIG. 10 shows a circuit structure of another type of shift register unit according to an exemplary embodiment. As shown in FIG. 10, the pull-down control circuit 40 may further include a seventh transistor M7 and an eighth transistor M8. A gate and a second electrode of the seventh transistor M7 are connected to the third power supply voltage terminal VDD, and a first electrode thereof is connected to a first electrode of the eighth transistor M8. A gate of the eighth transistor M8 is connected to the pull-up node PU, and a second electrode thereof is connected to the first power supply voltage terminal VGL.

Figure 11:
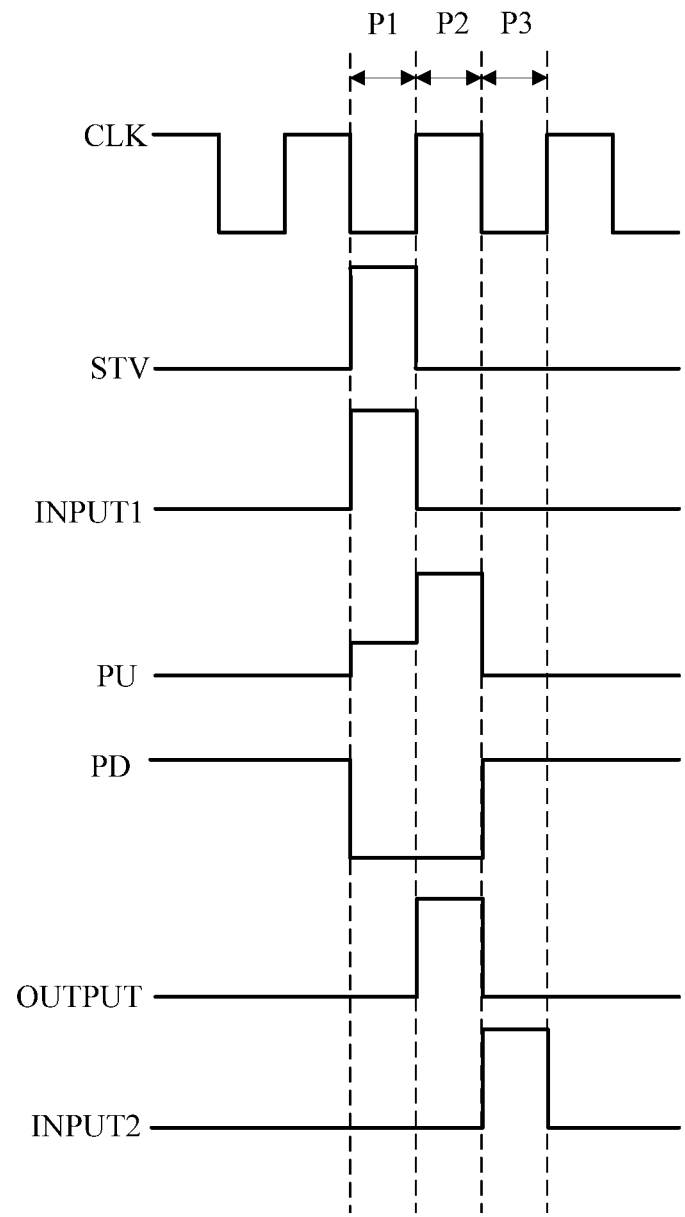
FIG. 11 is a timing signal diagram for controlling a shift register unit according to an exemplary embodiment.

FIG. 11 is a timing signal diagram for operating a shift register unit according to an exemplary embodiment. This timing signal diagram is exemplified in connection with a shift register unit shown in FIG. 7. It is assumed that in FIG. 7, the shift register unit is used for forward scanning, the first voltage terminal VFD is connected to the second power supply voltage terminal VGH, the second voltage terminal VBD is connected to the first power supply voltage terminal VGL, and the above transistors all are N-type transistors (and therefore an active level is a high level), an operation process of the shift register unit with respect to an image frame is as shown in FIG. 11.

For convenience of illustration, the clock signal received at the clock signal terminal CLK is shown to have a 50% duty cycle. The input signals received at the first and second signal inputs INPUT1, INPUT2 are shown in the form of pulses and have a pulse width equal to half the period of the clock signal. The duration of the three successive phases P1, P2, P3 is shown to be equal to half of the period of the clock signal.

In FIG. 11, in the first phase P1 of an image frame, CLK=0, INPUT1=1, INPUT2=0, and OUTPUT=0; wherein "0" indicates a low level and "1" indicates a high level.

At this phase of an image frame, INPUT1 inputs a high level. At this time, under control of the first signal input terminal INPUT1, the first auxiliary transistor Ma1 and the first input transistor Mb1 are turned on, and the high level outputted by the second power supply voltage terminal VGH is transmitted to the pull-up node PU through the above two transistors, to charge the pull-up node PU.

At this time, the storage capacitor C stores the voltage input to the pull-up node PU. Accordingly, the potential of the pull-up node PU gradually rises.

Under control of the pull-up node PU, the second transistor M2 is turned on, and the potential of the pull-down node PD is pulled down to the potential of the first power supply voltage terminal VGL.

At this time, since the potential of the pull-up node PU has not reached the active level, and the driving transistor Md in the output circuit 30 cannot be controlled to be turned on, the driving transistor Md remains turned off. Thus, OUTPUT outputs a low level.

In the second phase P2 of the image frame, CLK=1, INPUT1=0, INPUT2=0, and OUTPUT=1.

In the second phase, the first signal input terminal INPUT1 inputs a low level, so that the first auxiliary transistor Ma1 and the first input transistor Mb1 are turned off.

Under the effect of bootstrapping of the storage capacitor C, the potential of the pull-up node PU further rises. In the second phase P2, the potential of the pull-up node PU rises to enable controlling the driving transistor Md to turn on. At this time, the high level output by the clock signal terminal CLK may serve as a gate scan signal, and is output by the signal output terminal OUTPUT to a gate line connected to the shift register unit to scan the gate.

In the third phase P3 of the image frame, CLK=0, INPUT1=0, INPUT2=1, and OUTPUT=0.

In the third phase, the second signal input terminal INPUT2 inputs a high level. Under control of the high level, the second auxiliary transistor Ma2 and the second input transistor Mb2 are turned on, whereby the level output by the first power supply voltage terminal VGL is transmitted to the pull-up node PU through the second voltage terminal VBD, the second auxiliary transistor Ma2 and the second input transistor Mb2, to pull down the potential of the pull-up node PU to the potential of the first power supply voltage terminal VGL.

At this time, under control of the high level outputted by the third power supply voltage terminal VDD, the first transistor M1 is turned on, and the voltage of the third power supply voltage terminal VDD is transmitted to the pull-down node PD, and at this time, the potential of the pull-down node PD rises.

Under the effect of the pull-down node PD, the third transistor M3 and the fourth transistor M4 are turned on. The potential of the pull-up node PU is pulled down to the potential of the first power supply voltage terminal VGL through the third transistor M3; the potential of the signal output terminal OUTPUT is pulled down to the potential of the first power supply voltage terminal VGL through the fourth transistor M4.

Furthermore, after the completion of an image frame, the fifth transistor M5 and the sixth transistor M6 may be turned on through a reset signal input by the first reset signal terminal TGOA_RST, to pull down the potentials of the pull-up node PU and the signal output terminal to the potential of the first power supply voltage terminal VGL through the fifth transistor M5 and the sixth transistor M6, respectively.

Figure 12A:
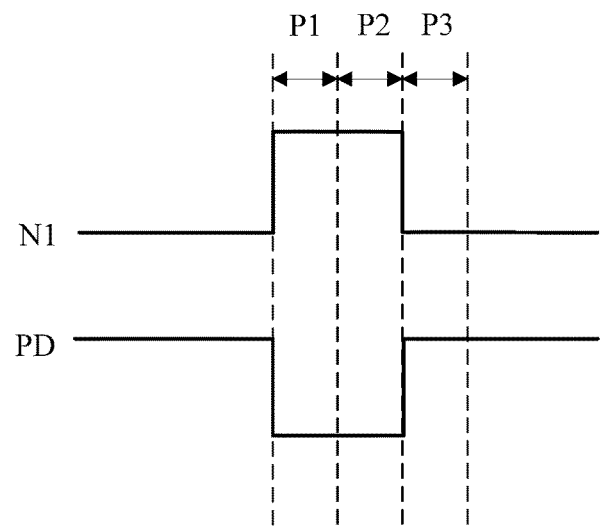
FIG. 12a is another timing signal diagram for controlling a shift register unit according to an exemplary embodiment.

FIG. 12a shows another timing signal diagram for controlling a shift register unit according to an exemplary embodiment. This timing signal diagram is also exemplified in connection with FIG. 7, and the shift register unit in FIG. 7 is configured in a way as FIG. 11 is described.

As described above, in the first stage P1, since INPUT1 is high, the first input transistor Mb1 is turned on, and the high level outputted by the second power supply voltage terminal VGH is transmitted to the terminal of the first auxiliary transistor Ma1 connected to the input control transistor Mc, namely, node N1, so the node N1 outputs the high level. In this phase, the pull-down node PD outputs a low level.

In the second phase P2, since INPUT1 is low, in an ideal case, the first input transistor Mb1 is turned off, and the node N1 becomes a low level. However, if the threshold voltage gets offset when the first input transistor Mb1 has been in a biased state for a long time, the node N1 still might leak to a high potential. In this phase, the pull-down node PD outputs a low level.

In the third phase P3, when the pull-down node PD rises in potential under control of the pull-down control circuit, the input control transistor Mc is turned on under control of the pull-down node PD, thereby pulling down potentials (not shown) of the second electrode (node N1) of the first auxiliary transistor Ma1 and the second electrode (node N2) of the second auxiliary transistor Ma2 to the potential of the first power supply voltage terminal VGL through the input transistor Mc.

In this exemplary embodiment, after the third phase P3 and before the start of a next image frame (namely, when the start signal terminal STV outputs a high level there), the pull-down node PD may always remain at a high level under the effect of the first transistor M1, so that it is possible to turn on the input control transistor Mc all the time under control of the pull-down node PD, thereby constantly pulling down the potentials of the nodes N1 and N2.

In this example, as shown in FIG. 7, the gate of the input transistor Mc, namely, the enable signal terminal is connected to the pull-down node PD.

Figure 12B:
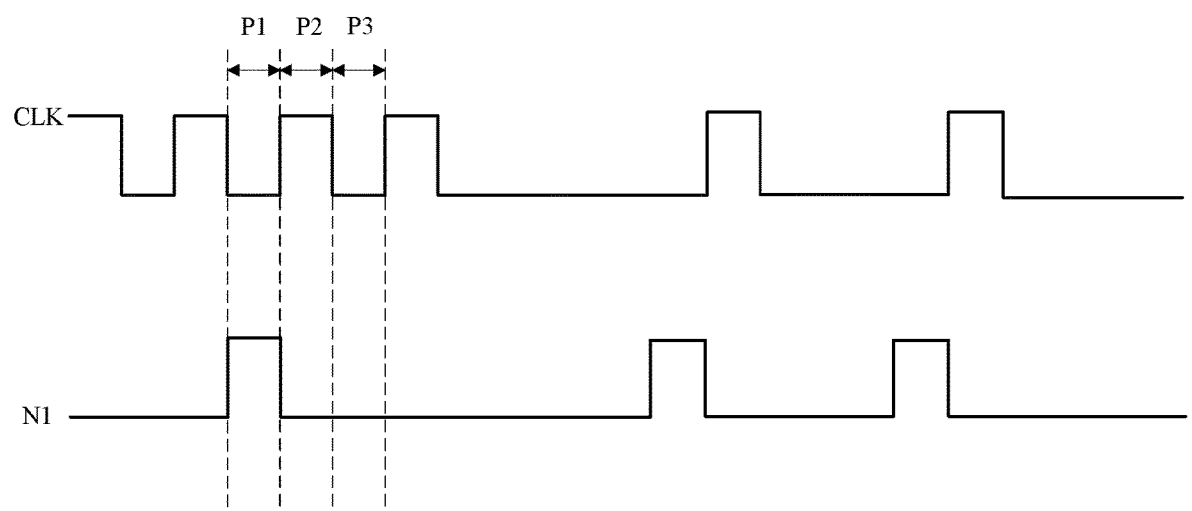
FIG. 12b is a further timing signal diagram for controlling a shift register unit according to an exemplary embodiment.

FIG. 12b shows a further timing signal diagram for controlling a shift register unit according to an exemplary embodiment. This timing signal diagram is exemplified in connection with the shift register unit shown in FIG. 8.

When the gate of the input transistor Mc is connected to the clock signal terminal CLK as shown in FIG. 8, the operation process of the shift register unit differs from that in FIG. 12a in that, in the second phase P2, since the clock signal terminal CLK outputs a high level, the potential of the node N1 is pulled down by the input control transistor Mc to a low level. Further, after the third phase P3 and before the start of a next image frame, whenever the clock signal terminal CLK outputs a high level, the potential of the node N1 is pulled down by the input control transistor Mc to a low level.

It may be appreciated that when the structure of the input control circuit 20 comprises the first input transistor Mc1 and the second input transistor Mc2 used for the first input sub-circuit and the second input sub-circuit, respectively as shown in FIG. 9, the turn-on or turn-off process of the first input transistor Mc1 and the second input transistor Mc2 is the same as that of the input transistor Mc described above in connection with FIGS. 12a and 12b.

Although the above exemplary embodiments have been described by taking all transistors as N-type transistors as an example, it may be understood that the above transistors may also be P-type transistors. For an N-type transistor, the active potential is a high potential and the inactive potential is a low potential. For a P-type transistor, the active potential is a low potential, and the inactive potential is a high potential. Based on this, it is only necessary to implement corresponding configuration for one or more of the control signals (such as the CLK, STV, INPUT1, and INPUT2 signals shown in FIG. 11) according to a specific circuit, so that the same operation process may be implemented for the shift register unit. It will be understood that the active potential or inactive potential is not intended to refer to a specific potential, but may include a range of potentials. Additionally, the term "voltage" is intended to be used interchangeably with "potential".

Figure 13:
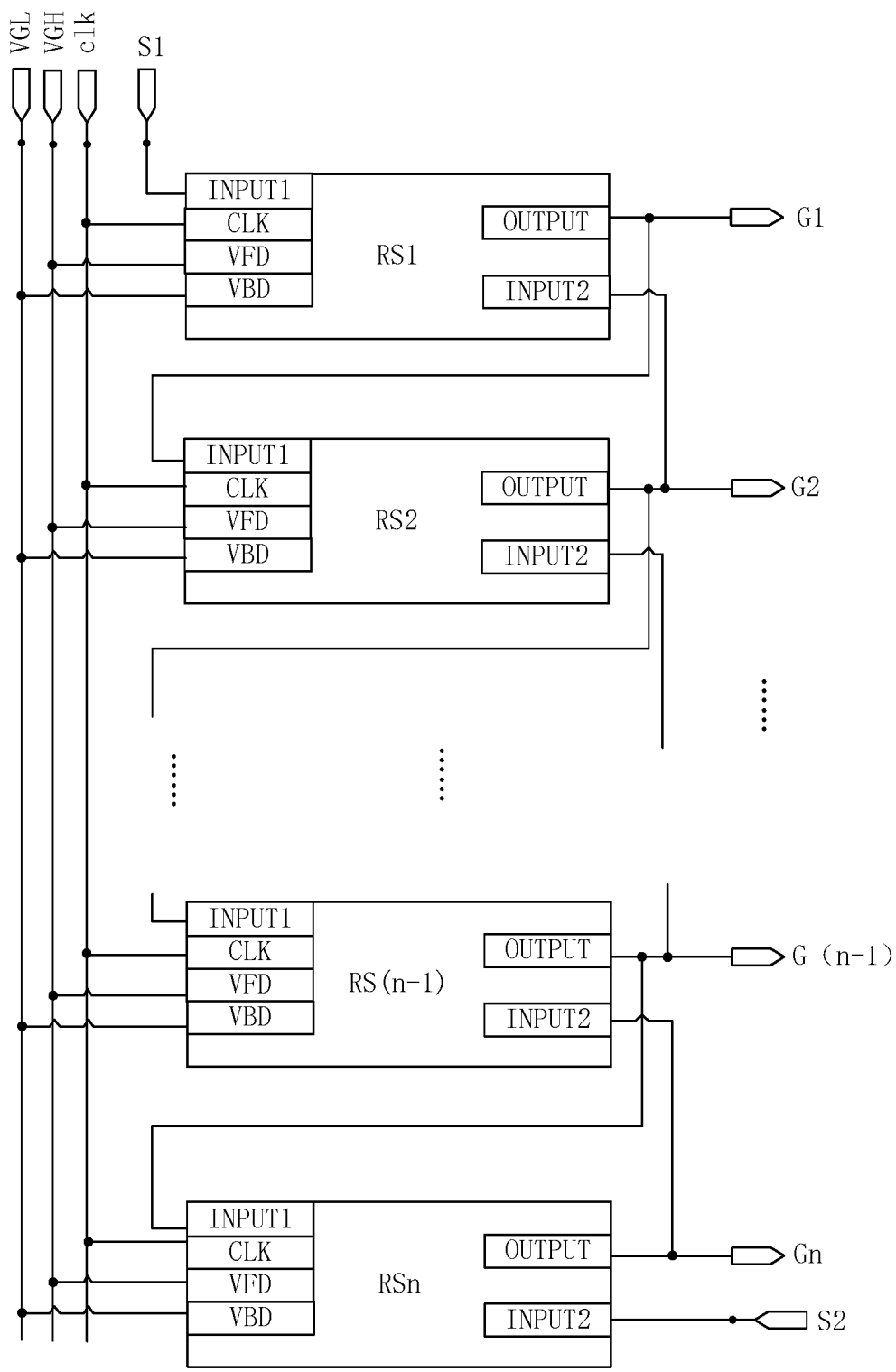
FIG. 13 is a schematic structural diagram of a gate driving circuit according to an exemplary embodiment.

FIG. 13 shows a gate driving circuit according to an exemplary embodiment. As shown in FIG. 13, the gate driving circuit comprises a plurality of cascaded shift register units (RS1, RS2, . . . , RSn) of any of the kinds as described above, wherein n≥2, and n is a positive integer.

The first signal input terminal INPUT1 of the first-stage shift register unit RS1 is connected to the first scan control terminal S1.

The signal output terminal of a previous-stage shift register unit except for the first-stage shift register unit RS1 is connected to the first signal input terminal INPUT1 of a next-stage shift register unit thereof.

The signal output terminal of the next-stage shift register unit except for the last-stage shift register unit RSn is connected to the second signal input terminal INPUT2 of the previous-stage shift register unit.

The second signal input terminal INPUT2 of the last-stage shift register unit RSn is connected to the second scan control terminal S2.

In addition, the clock signal terminal of each stage of shift register unit is connected to the system clock signal terminal clk.

According to an exemplary embodiment, the problem of the transistor threshold voltage offset upon bidirectional scanning may be better solved in the case that the input control circuit may control the first input circuit as well as the second input circuit (e.g., as shown in FIG. 5 and FIGS. 7-10, etc.) in the structure of each stage of shift register unit of the gate driving circuit.

Depending on the scanning mode, the first signal input and the second signal input of each shift register circuit are used interchangeably, and the first and second voltage terminals of each shift register circuit are interchangeably used.

When the gate scanning circuit adopts forward scanning, as shown in FIG. 13, the first voltage terminal VFD of each stage of the shift register unit is connected to the second power supply voltage terminal VGH, and the second voltage terminal VBD is connected to the first power supply voltage terminal VGL. The first scan control terminal S1 is connected to the start signal terminal STV, and the second scan control terminal S2 receives the reset signal.

When the gate scanning circuit adopts reverse scanning, the first voltage terminal VFD of each stage of the shift register unit is connected to the first power supply voltage terminal VGL, and the second voltage terminal VBD is connected to the second power supply voltage terminal VGH. The second scan control terminal S2 is connected to the start signal terminal STV, and the first scan control terminal S1 receives the reset signal.

When the solution of the embodiment of the present disclosure is employed, outputs of nodes (for example, the pull-up node PU) and the signal output terminal OUTPUT in the last-stage shift register unit RSn are tested upon forward scanning, and outputs of nodes (for example, the pull-up node PU) and the signal output terminal OUTPUT in the first-stage shift register unit RS1 are tested upon reverse scanning. The test result indicates that the waveform of the pull-up node PU is a solid-line waveform as shown in FIG. 3, that is, the output waveform of the pull-up node PU is normal, so the probability of leakage of the pull-up node PU may be reduced. The waveform of the above signal output terminal OUTPUT is as shown in FIG. 11, i.e., the output waveform is normal. Therefore, with the solution of the embodiment of the present disclosure, it allows solving the problem that the transistor threshold voltage offset causes leakage of the pull-up node PU and failed normal output of the signal output terminal OUTPUT.

Exemplary embodiments provide a display device including the gate driving circuit as described above. The gate driving circuit in the display device has the same structure and advantageous effects as the gate driving circuit provided in the foregoing embodiment.

It would be appreciated that, in exemplary embodiments, the display device may include, but is not limited to, a liquid crystal display device and an organic light-emitting diode display device. For example, the display device may be any product or component having a display function such as a display, a TV set, a digital photo frame, a mobile phone or a tablet computer.

Exemplary embodiments provide a method for driving any shift register unit described above. The method comprises, within an image frame:

In the first phase P1, the voltage of the first voltage terminal VFD is output by the first input circuit to the first terminal of the first input sub-circuit under control of the first signal input terminal INPUT1, and output to the pull-up node PU via the first input sub-circuit.

In the second phase P2, the signal of the clock signal terminal CLK is output by the output circuit to the signal output terminal OUTPUT under control of the pull-up node PU.

In the third phase P3, the second input circuit outputs the voltage of the second voltage terminal VBD to the pull-up node PU under control of the second signal input terminal INPUT2.

After the pull-down control circuit controls the potential of the pull-down node PD, the pull-down circuit pulls down the potentials of the pull-up node PU and the signal output terminal OUTPUT to the potential of the first power supply voltage terminal VGL under control of the pull-down node PD.

In this exemplary embodiment, in at least one time period after the second phase P2 and before the start of the next image frame, the input control circuit pulls down the potential of the first terminal of the first input sub-circuit, namely, the terminal (namely, node N1) connected to the input control circuit, to the potential of the first power supply voltage terminal VGL under control of the enable signal terminal EN. This may prevent the transistors in the first input sub-circuit from generating a bias voltage.

In one exemplary embodiment, in the case where the enable signal terminal EN is connected to the pull-down node PD, after the third phase P3 and before the start of the next image frame, for example, when the pull-down node PD outputs a high level, the potential of the node N1 is constantly pulled down to the potential of the first power supply voltage terminal VGL under control of the pull-down node PD.

In one exemplary embodiment, in the case where the enable signal terminal EN is connected to the clock signal terminal CLK, in the second phase P2, the input control circuit 20 pulls down the potential of the terminal of the first input sub-circuit 11 connected to the input control circuit 20 to the potential of the first power supply voltage terminal VGL under control of the clock signal terminal CLK. For example, in the second phase P2 described above, when the clock signal terminal CLK outputs a high level, the potential of the node N1 is pulled down to the potential of the first power supply voltage terminal VGL. After the third phase P3 and before the start of the next image frame, under control of the clock signal terminal CLK, for example, when the clock signal terminal CLK outputs a high level, the potential of the node N1 is pulled down to the potential of the first power supply voltage terminal VGL. Since the clock signal terminal CLK intermittently outputs a high level in a time period after the third phase P3 and before the start of the next image frame, the potential of the above node N1 is intermittently pulled down to the potential of the first power supply voltage terminal VGL in this time period.

It should be appreciated that when the second input circuit 12 comprises the second input sub-circuit 120, and the second input sub-circuit 120 is also connected to the input control circuit 20, the input control circuit 20 may, under control of the enable signal terminal EN, pull down the potential of the terminal of the second input sub-circuit 120 connected to the input control circuit 20 to the potential of the first power supply voltage terminal VGL. As such, this plays a role of preventing the pull-up node PU from the leakage phenomenon upon switching from the reverse scanning mode to the forward scanning mode.

When the structures of the above respective circuits are as described above, the turn-on states of respective transistors in the circuits are as described above.

It may be understood that the driving method according to the exemplary embodiments have the same technical effects as the structure of the shift register unit provided by the foregoing embodiment.

What are described above are only exemplary embodiments of the present disclosure, but the scope of the present disclosure is not limited thereto. Changes or substitutions readily envisaged by those skilled in the art within the technical scope revealed by the present disclosure all fall within the protection scope of the present disclosure. Therefore, the protection scope of the present disclosure should be determined by the protection scope of the appended claims.

The invention claimed is:

1. A shift register unit, comprising a first input circuit, an input control circuit, a pull-down control circuit, a pull-down circuit, an output circuit and a second input circuit;
   the first input circuit being connected to a first signal input terminal, a pull-up node, a first voltage terminal and the input control circuit, and comprises a first input sub-circuit, wherein the first input circuit is connected to the pull-up node via a first terminal of the first input sub-circuit and to the input control circuit via a second terminal of the first input sub-circuit, and the first input circuit being configured to, under control of the first signal input terminal, cause a voltage of the first voltage terminal to be output to the second terminal of the first input sub-circuit and output to the pull-up node via the first terminal of the first input sub-circuit;
   the input control circuit being also connected to a first power supply voltage terminal and an enable signal terminal; the input control circuit being configured to pull down a potential of the second terminal of the first input sub-circuit to a potential of the first power supply voltage terminal under control of the enable signal terminal;
   the pull-down control circuit being connected to a pull-down node, and the pull-down control circuit being configured to control a potential of the pull-down node;
   the output circuit being connected to a clock signal terminal, the pull-up node and a signal output terminal, and the output circuit being configured to output a signal of the clock signal terminal to the signal output terminal under control of the pull-up node;
   the pull-down circuit being connected to the pull-up node, the pull-down node, the signal output terminal and the first power supply voltage terminal, and the pull-down circuit being configured to pull down a potential of the pull-up node and the signal output terminal to a potential of the first power supply voltage terminal under control of the pull-down node; and
   the second input circuit being connected to a second signal input terminal, a second voltage terminal and the pull-up node; the second input circuit being configured to output the voltage of the second voltage terminal to the pull-up node under control of the second signal input terminal.

2. The shift register unit according to claim 1, wherein the second input circuit comprises a second input sub-circuit;
   the second input circuit is connected to the pull-up node via a first terminal of the second input sub-circuit, and is further connected to the input control circuit via a second terminal of the second input sub-circuit;
   the second input circuit is configured to, under control of the second signal input terminal, cause a voltage of the second voltage terminal to be output to a second terminal of the second input sub-circuit and output to the pull-up node via the first terminal of the first input sub-circuit;
   the input control circuit is further configured to pull down a potential of the second terminal of the second input sub-circuit to a potential of the first power supply voltage terminal under control of the enable signal terminal.

3. The shift register unit according to claim 2, wherein the input control circuit comprises a first input control transistor and a second input control transistor;
   a gate of the first input control transistor is connected to the enable signal terminal, a first electrode of the first input control transistor is connected to the first power supply voltage terminal, and a second electrode of the first input control transistor is connected to the first input sub-circuit;
   a gate of the second input control transistor is connected to the enable signal terminal, a first electrode of the second input control transistor is connected to the first power supply voltage terminal, and a second electrode of the second input control transistor is connected to the second input sub-circuit.

4. The shift register unit according to claim 2, wherein the second input sub-circuit is further connected to the second signal input terminal;
   the second input sub-circuit comprises a second auxiliary transistor; a gate of the second auxiliary transistor is connected to the second signal input terminal, a first electrode of the second auxiliary transistor is connected to the pull-up node, and a second electrode of the second auxiliary transistor is connected to the input control circuit.

5. The shift register unit according to claim 4, wherein the second input circuit further comprises a second input transistor;
   a gate of the second input transistor is connected to the second signal input terminal, a first electrode of the second input transistor is connected to the second electrode of the second auxiliary transistor, and a second electrode of the second input transistor is connected to the second voltage terminal.

6. The shift register unit according to claim 2, wherein the input control circuit comprises an input control transistor;
   a gate of the input control transistor is connected to the enable signal terminal, a first electrode of the input control transistor is connected to the first power supply voltage terminal, and a second electrode of the input control transistor is connected to the first input sub-circuit.

7. The shift register unit according to claim 1, wherein the input control circuit comprises an input control transistor;

a gate of the input control transistor is connected to the enable signal terminal, a first electrode of the input control transistor is connected to the first power supply voltage terminal, and a second electrode of the input control transistor is connected to the first input sub-circuit.

8. The shift register unit according to claim 7, wherein the second input circuit comprises a second input sub-circuit:
the second electrode of the input control transistor is further connected to the second input sub-circuit.

9. The shift register unit according to claim 1, wherein the enable signal terminal is connected to the pull-down node or the clock signal terminal.

10. The shift register unit according to claim 1, wherein the first input sub-circuit is further connected to the first signal input terminal;
the first input sub-circuit comprises a first auxiliary transistor; a gate of the first auxiliary transistor is connected to the first signal input terminal, a first electrode of the first auxiliary transistor is connected to the pull-up node, and a second electrode of the first auxiliary transistor is connected to the input control circuit.

11. The shift register unit according to claim 10, wherein the first input circuit further comprises a first input transistor;
a gate of the first input transistor is connected to the first signal input terminal, a first electrode of the first input transistor is connected to the second electrode of the first auxiliary transistor, and a second electrode of the first input transistor is connected to the first voltage terminal.

12. The shift register unit according to claim 1, wherein the output circuit comprises a driving transistor and a storage capacitor;
a gate of the driving transistor is connected to the clock signal terminal, a first electrode of the driving transistor is connected to the signal output terminal, and a second electrode of the driving transistor is connected to the clock signal terminal;
a terminal of the storage capacitor is connected to the gate of the driving transistor, and the other terminal of the storage capacitor is connected to the first electrode of the driving transistor.

13. The shift register unit according to claim 1, wherein the pull-down control circuit further connects a third power supply voltage terminal, the first power supply voltage terminal and the pull-up node;
the pull-down control circuit comprises a first transistor and a second transistor;
a gate and a second electrode of the first transistor are connected to the third power supply voltage terminal, and a first electrode of the first transistor is connected to the pull-down node;
a gate of the second transistor is connected to the pull-up node, a first electrode of the second transistor is connected to the pull-down node, and a second electrode of the second transistor is connected to the first power supply voltage terminal;
wherein a width-to-length ratio of the second transistor is greater than that of the first transistor.

14. The shift register unit according to claim 1, wherein the pull-down circuit comprises a third transistor and a fourth transistor;
a gate of the third transistor is connected to the pull-down node, a first electrode of the third transistor is connected to the pull-up node, and a second electrode of the third transistor is connected to the first power supply voltage terminal;
a gate of the fourth transistor is connected to the pull-down node, a first electrode of the fourth transistor is connected to the signal output terminal, and a second electrode of the fourth transistor is connected to the first power supply voltage terminal.

15. The shift register unit according to claim 1, wherein the shift register unit further comprises a first reset circuit;
the first reset circuit is connected to a first reset signal terminal, the pull-up node, the signal output terminal and the first power supply voltage terminal; the first reset circuit is configured to pull down potentials of the pull-up node and the signal output terminal to a potential of the first power supply voltage terminal under control of the first reset signal terminal;
the first reset circuit comprises a fifth transistor and a sixth transistor;
a gate of the fifth transistor is connected to the first reset signal terminal, a first electrode of the fifth transistor is connected to the pull-up node, and a second electrode of the fifth transistor is connected to the first power supply voltage terminal;
a gate of the sixth transistor is connected to the first reset signal terminal, a first electrode of the sixth transistor is connected to the signal output terminal, and a second electrode of the sixth transistor is connected to the first power supply voltage terminal.

16. A gate driving circuit, comprising a plurality of cascaded shift register units according to claim 1;
a first signal input terminal of a first-stage shift register unit being connected to a first scan control terminal;
a signal output terminal of a previous-stage shift register unit except for the first-stage shift register unit being connected to a first signal input terminal of a next-stage shift register unit;
a signal output terminal of the next-stage shift register unit except for a last-stage shift register unit being connected to a second signal input terminal of the previous-stage shift register unit; and
a second signal input terminal of the last-stage shift register unit being connected to a second scan control terminal.

17. A display device, comprising a gate driving circuit according to claim 16.

18. A method for driving a shift register unit according to claim 1, the method comprising, within an image frame:
in a first phase, outputting a voltage of the first voltage terminal by the first input circuit to the pull-up node under control of the first signal input terminal;
in a second phase, outputting a signal of the clock signal terminal by the output circuit to the signal output terminal under control of the pull-up node;
in a third phase, outputting a voltage of the second voltage terminal by the second input circuit to the pull-up node under control of the second signal input terminal; controlling the potential of the pull-down node by the pull-down control circuit, so that the pull-down circuit pulls down the potential of the pull-up node and the signal output terminal to the potential of the first power supply voltage terminal under control of the pull-down node;
wherein in at least one time period after the second phase and before start of a next image frame, the input control circuit pulls down the potential of the second terminal of the first input sub-circuit in the first input circuit to the potential of the first power supply voltage terminal under control of the enable signal terminal.

19. The method according to claim 18, wherein in a case where the enable signal terminal is connected to the clock signal terminal, in the second phase, the method comprises: the input control circuit pulls down the potential of the second terminal of the first input sub-circuit to the potential of the first power supply voltage terminal under control of the clock signal terminal.

20. The method according to claim 18, wherein the clock signal has a 50% duty cycle, and wherein the first, second, and third phases have a duration equal to a half of a period of the clock signal.

* * * * *